(12) United States Patent
Nakamoto

(10) Patent No.: US 8,604,836 B2
(45) Date of Patent: Dec. 10, 2013

(54) DETECTOR CIRCUIT

(75) Inventor: Hiroyuki Nakamoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/405,968

(22) Filed: Feb. 27, 2012

(65) Prior Publication Data

US 2012/0235733 A1  Sep. 20, 2012

(30) Foreign Application Priority Data

Mar. 18, 2011  (JP) .................................. 2011-60334

(51) Int. Cl.
*H03K 5/153* (2006.01)

(52) U.S. Cl.
USPC .................. 327/58; 327/62; 327/87; 327/104; 327/128; 327/343

(58) Field of Classification Search
USPC ........... 327/58, 61, 77, 78, 79, 83, 87, 53, 54, 327/66, 67, 104, 128, 62, 65, 336, 339, 343, 327/344, 345, 355, 361, 363; 363/81, 126
See application file for complete search history.

(56) References Cited

U.S. PATENT DOCUMENTS

| 3,885,168 | A | * | 5/1975 | Matsuzaki ...................... 327/61 |
| 4,362,996 | A | * | 12/1982 | Priebe .............................. 327/58 |
| 4,637,003 | A | * | 1/1987 | Yokogawa ............... 369/124.01 |
| 4,689,576 | A | * | 8/1987 | Wisseman ..................... 327/362 |
| 5,629,639 | A | * | 5/1997 | Williams ......................... 327/60 |
| 6,429,638 | B1 | * | 8/2002 | Wight et al. ............... 324/103 P |
| 6,608,502 | B2 | | 8/2003 | Aoki et al. |
| 7,777,552 | B1 | * | 8/2010 | Gilbert ......................... 327/350 |

FOREIGN PATENT DOCUMENTS

| JP | 9-186526 | | 7/1997 |
| JP | 2002-314341 | A | 10/2002 |
| JP | 2005-142955 | A | 6/2005 |

* cited by examiner

*Primary Examiner* — Lincoln Donovan
*Assistant Examiner* — Jung H. Kim
(74) *Attorney, Agent, or Firm* — Fujitsu Patent Center

(57) ABSTRACT

A detector circuit, has a first diode, to an anode of which an AC signal is input and to which a constant voltage is supplied, a second diode, to an anode of which the constant voltage is supplied, and a difference current generation circuit, which generates the difference current between a first current flowing in the first diode and a second current flowing in the second diode.

12 Claims, 15 Drawing Sheets

DETECTOR CIRCUIT

CROSS-REFERENCE TO RELATED APPLICATION

This application is based upon and claims the benefit of priority of the prior Japanese Patent Application No. 2011-060334,filed on Mar. 18, 2011,the entire contents of which are incorporated herein by reference.

FIELD

The embodiment relates to a detector circuit.

BACKGROUND

A detector circuit is a circuit which detects the power of a high-frequency signal (RF signal) or other alternating current (AC) signal, and is for example used as a circuit to detect the output power of a power amplifier provided in a portable communication terminal or similar. A power detector circuit performs envelope detection of a high-frequency signal using for example a diode. Such a circuit applies the high-frequency signal to the diode, rectifies the voltage exceeding the diode threshold voltage and converts this into a current, and converts the rectified AC current signal into a direct current (DC) voltage signal using a resistor and a capacitor.

However, the threshold voltage of a normal diode varies due to the influence of temperature, so that use of a simple diode alone for power detection would result in fluctuation of the output level of the power detector circuit.

Japanese Patent Application Laid-open No. 2005-142955 discusses a power detector which eliminates the influence of fluctuation of the diode threshold voltage. In this power detector, an input high-frequency signal is distributed to the anodes of two diodes, a bias current from a bias circuit is supplied to each of the diodes, a DC voltage is generated across a load resistor provided in parallel with the diodes, and the voltage which changes according to the high-frequency signal applied to the diodes is input to a differential amplifier via an inductor. The differential amplifier outputs the difference voltage of two voltages which change according to the high-frequency signal applied to each of the diodes.

The detector circuit discussed in Japanese Patent Application Laid-open No. 2005-142955 computes the difference voltage of two voltages resulting from distribution of the high-frequency signal according to a power distribution ratio determined in advance, and so the output voltage of the differential amplifier is detected as the power level of the high-frequency signal, and even if the threshold voltages of the diodes vary due to temperature changes, the variation in the threshold voltages of the diodes are cancelled by the difference, so that the influence of variation of the threshold voltages is compensated.

However, the above-described power detector uses a differential amplifier. A differential amplifier has a voltage offset due to manufacturing variation, and so there is a limit to the precision of detection of a difference voltage. Further, the output common mode and gain which are characteristics of the differential amplifier tend to fluctuate with changes in the power supply voltage, so the precision of the detection tends to lower by power supply fluctuations.

SUMMARY

Hence an object of this embodiment is to provide a detector circuit with heightened detection precision.

According to a first aspect of the embodiment, a detector circuit, has a first diode, to an anode of which an AC signal is input and to which a constant voltage is supplied, a second diode, to an anode of which the constant voltage is supplied, and a difference current generation circuit, which generates the difference current between a first current flowing in the first diode and a second current flowing in the second diode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
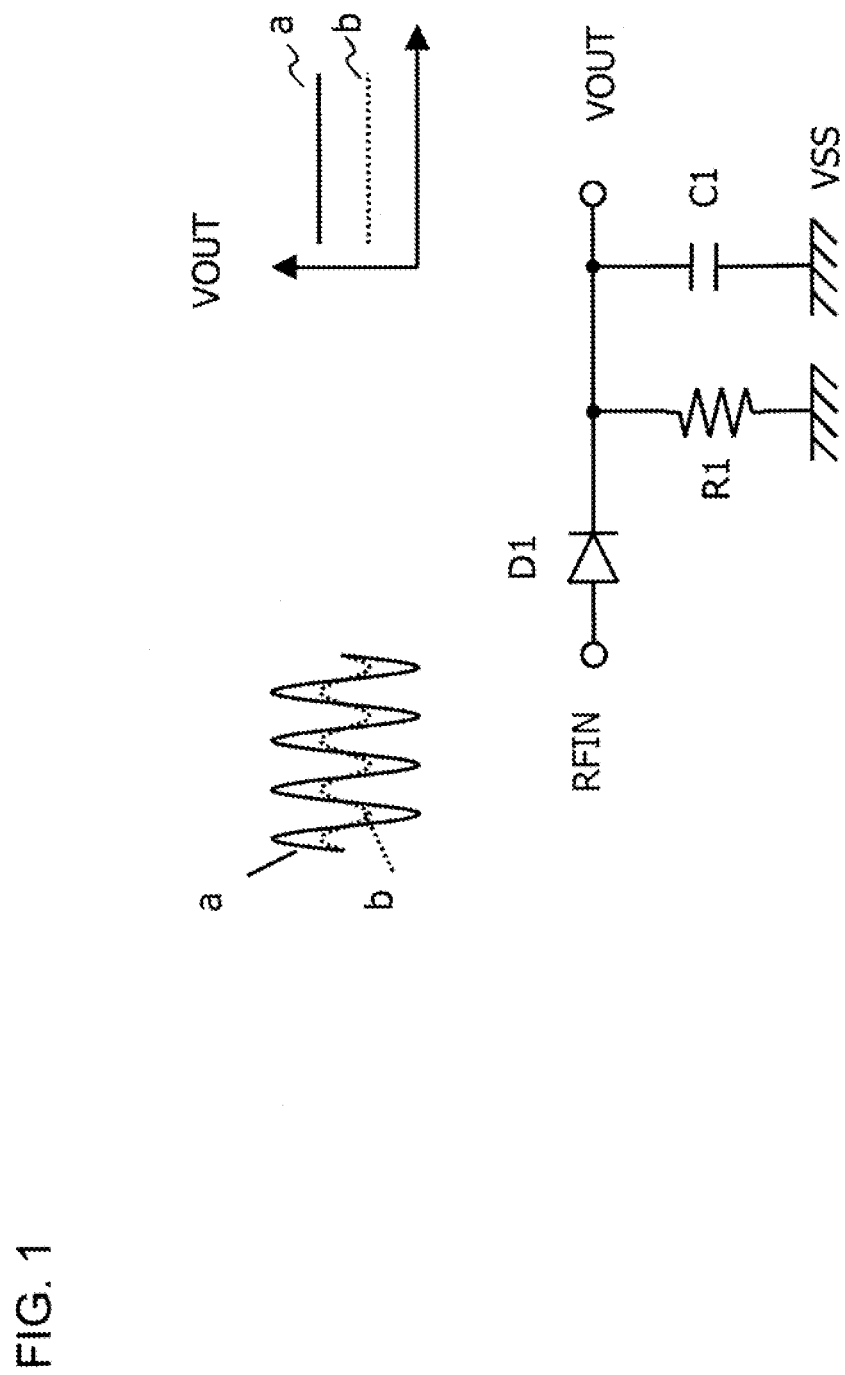
FIG. 1 illustrates operation of a power detector circuit using a diode.

FIG. 1 illustrates operation of a power detector circuit using a diode. In this power detector circuit, the high-frequency signal, which is the AC signal for power detection, is supplied to the input terminal RFIN, and when the high-frequency signal voltage exceeds the threshold voltage of the diode D1, the diode D1 becomes conducting and a current occurs. This rectified current is smoothed by the capacitor C1 and is converted into a DC voltage by the resistor R1. When the high-frequency signal has higher power, as in "a" in FIG. 1, the voltage VOUT at the output terminal is high, and when the power is lower, as in "b" in FIG. 1, the voltage VOUT at the output terminal is also low. This is an envelope detector circuit employing a diode D1, resistor R1 and capacitor C1.

For example, by coupling the output of a power amplifier, the power of which is to be detected, to the anode of the diode D1, the output power of the power amplifier can be detected.

However, as explained above, the threshold voltage of the diode D1 fluctuates due to temperature, and hence the output voltage is varied due to this fluctuation of the threshold voltage, and the precision of the detected power is lower.

Figure 2:
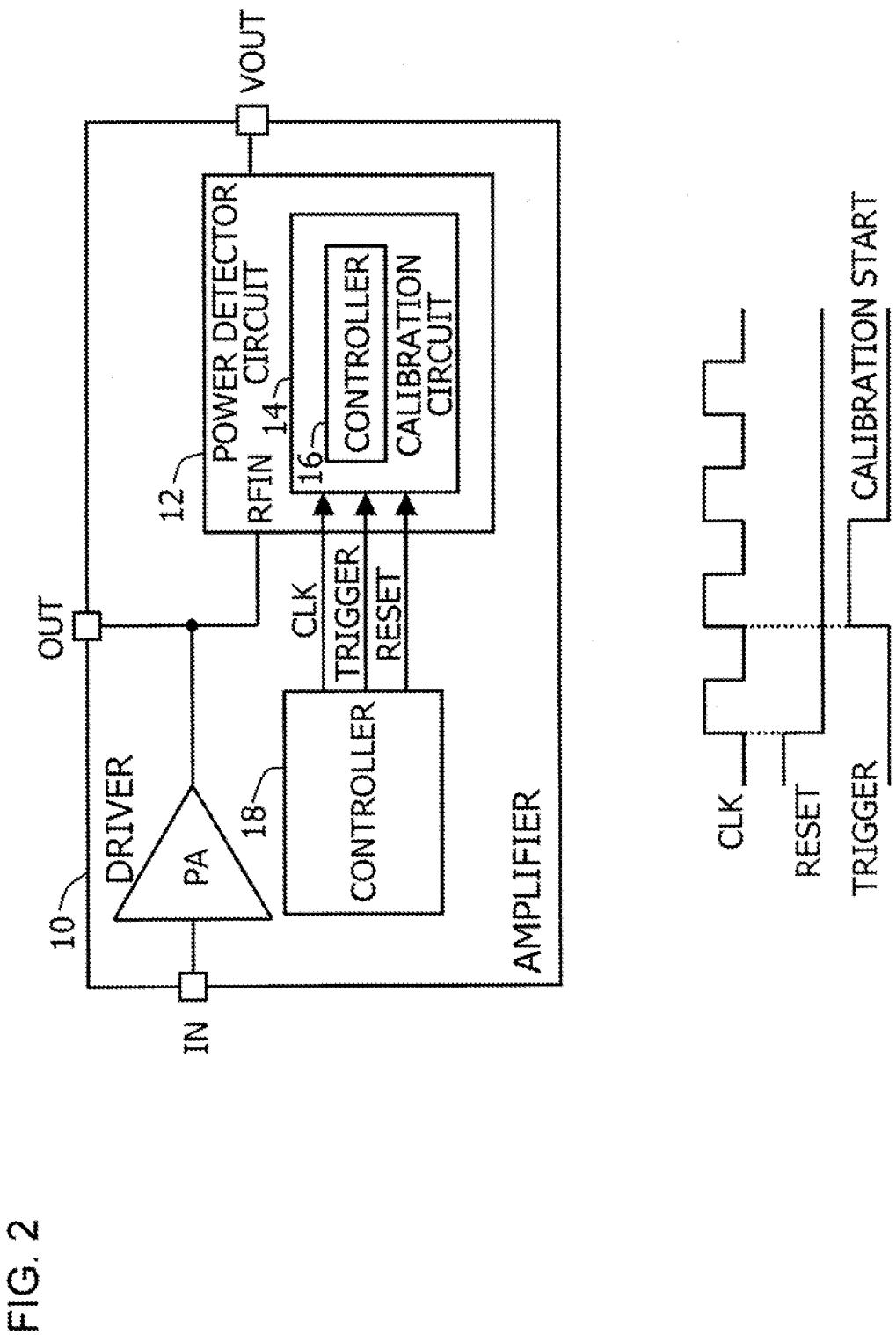
FIG. 2 illustrates an example of application of the power detector circuit of this embodiment.

FIG. 2 illustrates an example of application of the power detector circuit of this embodiment. In this application example, the power of the output OUT of the power amplifier PA in the amplifier 10 is detected by the power detector circuit 12, and is output as the output voltage VOUT. The power detector circuit 12 has a circuit for power detection, described below, and a calibration circuit 14 which performs calibration thereof. The calibration circuit 14 performs an operation to calibrate the power detector circuit by means of an incorporated calibration control circuit 16.

Further, upon power activation, when the power amplifier PA does not output a high-frequency signal, and at other times appropriate for calibration, the power detection control circuit 18 resets the calibration circuit 14 by driving a reset pulse Reset to H level, and after releasing reset by driving the reset pulse Reset to L level, causes the start of calibration operation by driving a trigger signal Trigger to H level. The clock CLK is a calibration operation synchronization clock.

Next, the power detector circuit in this embodiment is explained.

(First Embodiment)

Figure 3:
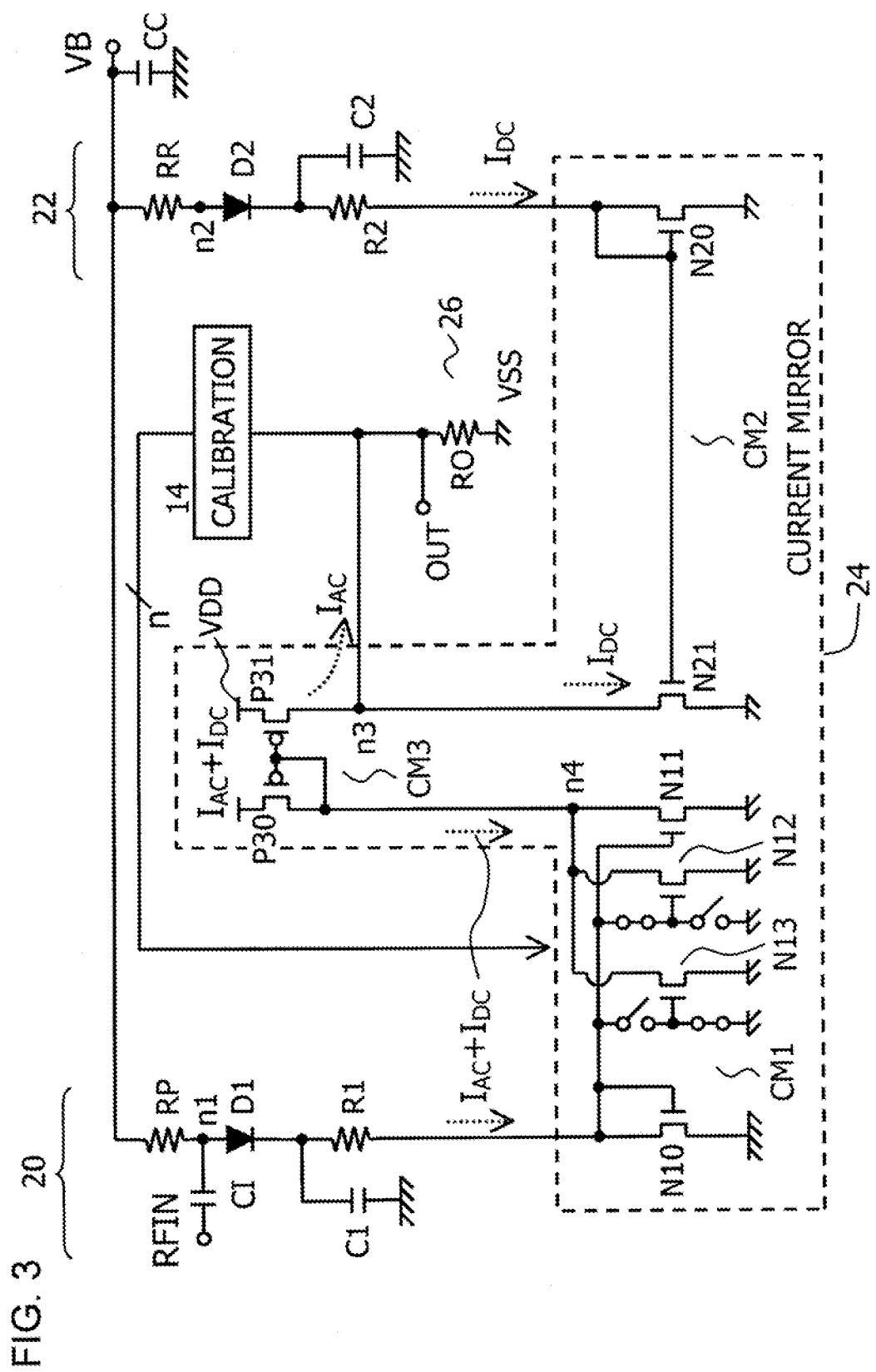
FIG. 3 illustrates the power detector circuit of the first embodiment.

FIG. 3 illustrates the power detector circuit of the first embodiment. The power detector circuit of FIG. 3 has an input circuit 20 having a first diode D1 to which a high-frequency signal which is an AC signal is supplied via the input capacitor CI of an input terminal RFIN, and a reference circuit 22 having a second diode D2. The input capacitor CI cuts the DC component of the high-frequency signal applied to the input terminal RFIN, and applies the AC component to the anode of the first diode D1. That is, the AC component of the high-frequency signal is applied to node n1. The first diode D1 is a diode which rectifies the AC component applied to node n1, and the second diode D2 is a compensating diode which compensates fluctuation of the diode threshold voltage. Both diodes D1 and D2 are unidirectional elements having PN junctions or similar.

A DC voltage VB, which is a power supply voltage and constant bias voltage, is applied, via first and second resistors RP and RR, to the anode terminals n1 and n2 of the first and second diodes D1 and D2. The first resistor RP is a resistor to supply the DC voltage VB to the terminal n1 to which the above-described AC component is applied. The second resistor RR is provided in the reference circuit 22 as well, corresponding to the first resistor RP.

A smoothing circuit including the capacitor C1 and third resistor R1 is provided at the cathode of the first diode D1. The third resistor R1 also adjusts the current quantity through the resistance value. Corresponding to this, a fourth resistor R2 and a capacitor C2, equal to the values of the devices R1, C1 coupled to the input circuit 20, are provided at the cathode of the second diode D2 as well. However, an AC component is not applied to the second diode D2, and so the capacitor C2 is not need, but is provided for the sake of balance with the input circuit 20.

The sum current $I_{AC}+I_{DC}$ of a current $I_{AC}$ which is the result of rectifying and smoothing the AC component of the high-frequency signal which is the AC signal, and a current $I_{DC}$ which constantly flows due to the DC voltage VB, flows in the resistor R1 of the input current 20. The current $I_{AC}$ is the DC current obtained by rectification by the diode D1 and smoothing by C1 and R1. On the other hand, a current $I_{DC}$ due to the DC voltage VB constantly flows in the resistor R2 of the reference circuit 22. The resistors RP and RR and the resistors R1 and R2 are designed to have respectively equal values, and thus the currents $I_{DC}$ of the two circuits 20 and 22 are substantially equal.

A decoupling capacitor CC is provided at the node supplying the DC voltage VB, so that the AC component of the high-frequency signal supplied to the input terminal RFIN does not propagate to the supply node and cause the DC voltage to fluctuate.

Further, the power detector circuit has a difference current generation circuit 24 which generates, at the node n3, a current $I_{AC}$ which is the difference between the current $I_{AC}+I_{DC}$ generated by the input current 20, and the current $I_{DC}$ generated by the reference current 22, and an output current 26 which converts the magnitude of the difference current $I_{AC}$ into a voltage of the output terminal OUT. The output circuit 26 has an output resistor RO.

The difference current generation circuit 24 has a first current mirror circuit CM1 which copies the current $I_{AC}+I_{DC}$ of the input circuit 20 to the node n4; a second current mirror circuit CM2 which copies the current $I_{DC}$ of the reference circuit 22 to the node n3; and a third current mirror circuit CM3 which copies the current $I_{AC}+I_{DC}$ of the node n4 to the side of the node n3. The first current mirror circuit CM1 has an N-channel MOS (NMOS) transistor N10, and, NMOS transistors N11, N12, N13, the gates of which are coupled in common to the drain and gate of this NMOS transistor N10, and the drains of which are coupled to the node n4. Current is copied at a current mirror ratio according to the combined transistor channel widths of the transistor N10 and the transistors N11, N12 and N13.

The second current mirror circuit CM2 has an NMOS transistor N20 coupled to the reference circuit 22, and a transistor N21 the gate of which is coupled to the drain and gate of this NMOS transistor N20. In this current mirror circuit CM2 also, current is copied at a current mirror ratio according to the transistor channel widths of the transistors N20 and N21. The third current mirror circuit CM3 comprises P-channel MOS (PMOS) transistors P30 and P31 coupled to the power supply voltage VDD, and copies the current $I_{AC}+I_{DC}$ of the node n4 to the side of the transistor P31 at a current mirror ratio according to the transistor channel widths of the transistors P30 and P31.

Focusing on the node n3, the copied current $I_{AC}+I_{DC}$ is supplied from the PMOS transistor P31, and the copied current $I_{DC}$ flows to the NMOS transistor N21, so that the difference current $I_{AC}$ flows to the output circuit 26. The output circuit 26 converts the difference current $I_{AC}$ into a voltage by means of the output resistor RO, and outputs the converted voltage from the output terminal OUT.

That is, this power detector circuit generates the difference in the detection signals of the rectifying diode D1 and the compensating diode D2 not by means of a differential amplifier, but by means of the difference current generation circuit 24. This difference current generation circuit 24 has current mirror circuits, and does not have a differential amplifier. Hence there is no problem of fluctuation in a differential amplifier offset voltage and output potential.

Further, the power detector circuit has a calibration circuit 14 which performs calibration so that the current $I_{DC}$ copied from the input circuit 20 and the current $I_{DC}$ copied from the reference circuit 22 are equal at the node n3. That is, the calibration circuit 14 calibrates the current mirror ratio of one of the current mirror circuits so that the currents $I_{DC}$ from both sides are equal, in order that the difference current generated at the node n3 is correct and the current $I_{AC}$ remains.

In the power detector circuit of FIG. 3, an output circuit 26 and calibration circuit 14 may be provided on the side of the node n4. In this case, the drain of the transistor P31 of the third current mirror circuit CM3 is coupled to the gates of the transistors P30 and P31, to copy the current $I_{DC}$ on the side of the node n3 to the side of the transistor P30. The difference current of the current $I_{AC}+I_{DC}$ of the input circuit 20 and the current $I_{DC}$ of the reference circuit 22 is then generated at the node n4.

(1) During Normal Operation (Operation When a High-frequency Signal, Which is an AC Signal, is Input to the Input Terminal RFIN)

Figure 4:
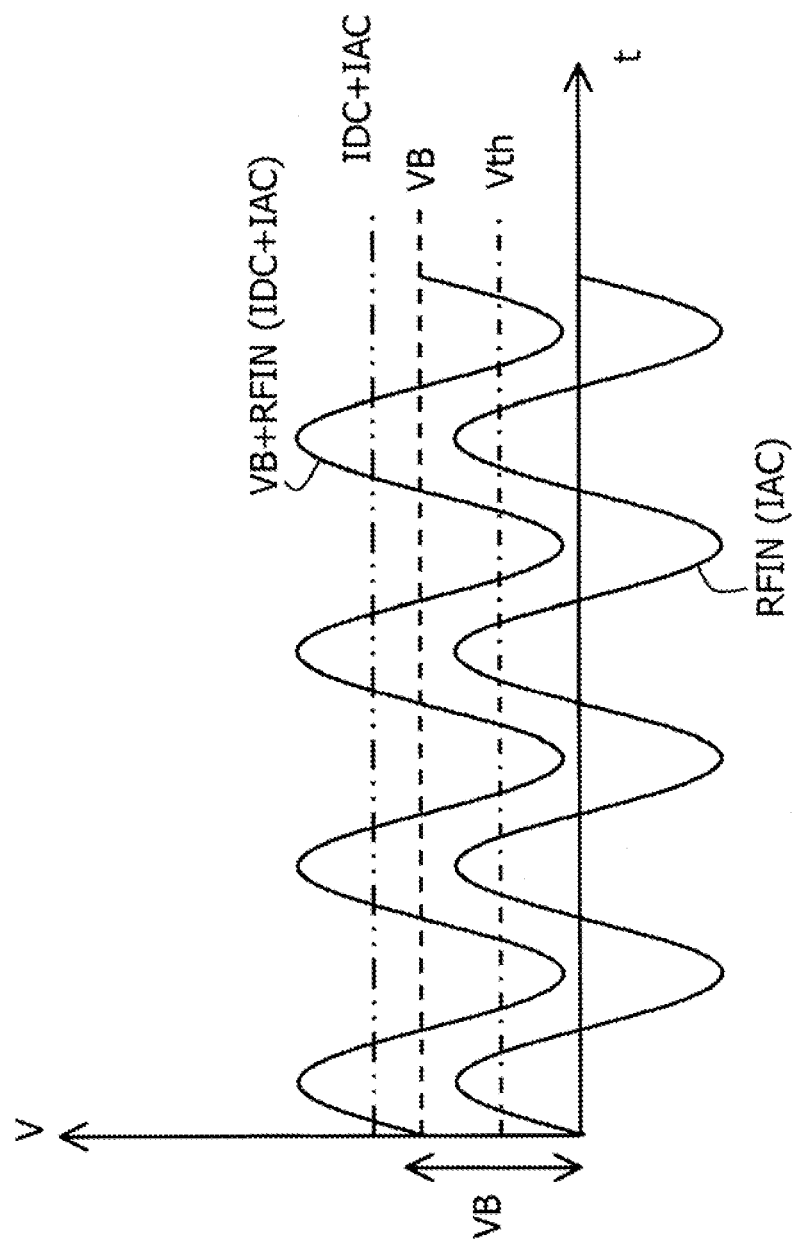
FIG. 4 illustrates a normal operation of the power detector circuit of FIG. 3.

First, power detection operation, which is normal operation of the power detector circuit of FIG. 3, is explained. FIG. 4 explains normal operation of the power detector circuit of FIG. 3. In FIG. 4 the horizontal axis plots time t and the vertical axis plots the voltage V; the relation between the voltage VB+RFIN applied to the node n1 in the input circuit 20 and the threshold voltage Vth of the diode D1 is illustrated. In FIG. 3, RFIN is the AC component of the high-frequency signal applied to the input terminal RFIN.

To the node n1 which is the anode of the first diode D1 are applied the DC voltage VB via the first resistor RP, and the AC voltage (RFIN) of the high-frequency signal supplied from the input RFIN via the input capacitor CI. That is, the voltage VB+RFIN is applied. When this voltage exceeds the threshold Vth of the diode D1, the diode is turned on, and a rectified current is generated. The rectified current due to the first diode D1 is converted into a DC current by the capacitor C1 and third resistor R1. By this means, the sum current $I_{DC}+I_{AC}$ of the current $I_{DC}$ which constantly flows due to the DC voltage VB, and the current $I_{AC}$ which flows depending on the AC voltage, flows in the diode Dl.

On the other hand, the DC voltage VB is applied via the second resistor RR to the node n2 at the anode of the second diode D2, so that the same current $I_{DC}$ which flows in the steady state in the first diode D1 flows in the fourth resistor R2.

The currents $I_{DC}+I_{AC}$ and $I_{DC}$ flowing in the two resistors R1 and R2 are current-mirrored by the first and second current mirror circuits CM1 and CM2 respectively which comprise NMOS transistors within the difference current detector circuit 24, and the current $I_{AC}+I_{DC}$ at the node n4 is current-mirrored to transistor P31 by the third current mirror circuit CM3, comprising PMOS transistors. By coupling the drain of the transistor P31 of the third current mirror circuit CM3 and the drain of the transistor N21 of the second current mirror circuit CM2 at the node n3, the difference current $I_{AC}$ of these is generated at the node n3. This difference current $I_{AC}$ flows to the output resistor RO in the output circuit 26, and an output potential proportional to the difference current $I_{AC}$ is generated at the output terminal OUT.

When the threshold voltages of the first and second diodes D1 and D2 change due to process and temperature fluctuations, the absolute values of the currents flowing therewithin change, and the current flowing in the resistor R1 changes to $I_{AC}+I_{DC}+\Delta I$, while the current flowing in the resistor R2 similarly changes to $I_{DC}+\Delta I$. In this case also, the difference current $I_{AC}$ (=$I_{AC}+I_{DC}+\Delta I-I_{DC}-\Delta I$) flows in the output resistor RO due to the current mirror circuits CM1, CM2, CM3 included in the difference current generation circuit 24, so that the current changes $\Delta I$ arising from the fluctuations in threshold voltages are cancelled out. Also, the difference current $I_{AC}$ changes depending on the power of the input high-frequency signal, so that the output circuit 26 can generate, at the output terminal OUT, an output potential which rises or falls monotonically with the power of the input AC signal.

(2) During Error Occurrence (Upon Manufacturing Variation Between the Diodes D1 and D2, or When a Current Mirror Error Occurs)

Next, operation is explained in cases in which an error current or an offset current occurs due to relative variation in the diodes D1 and D2 or to current copying error of a current mirror circuit. When such error currents occur, the error current is combined with the difference current $I_{AC}$ flows into the output circuit 26, and the correct output isn't obtained, because an accurate current $I_{AC}$ does not correspond to the power of the input high-frequency signal. Hence there is a calibration circuit to reduce such error currents to zero.

Figure 5:
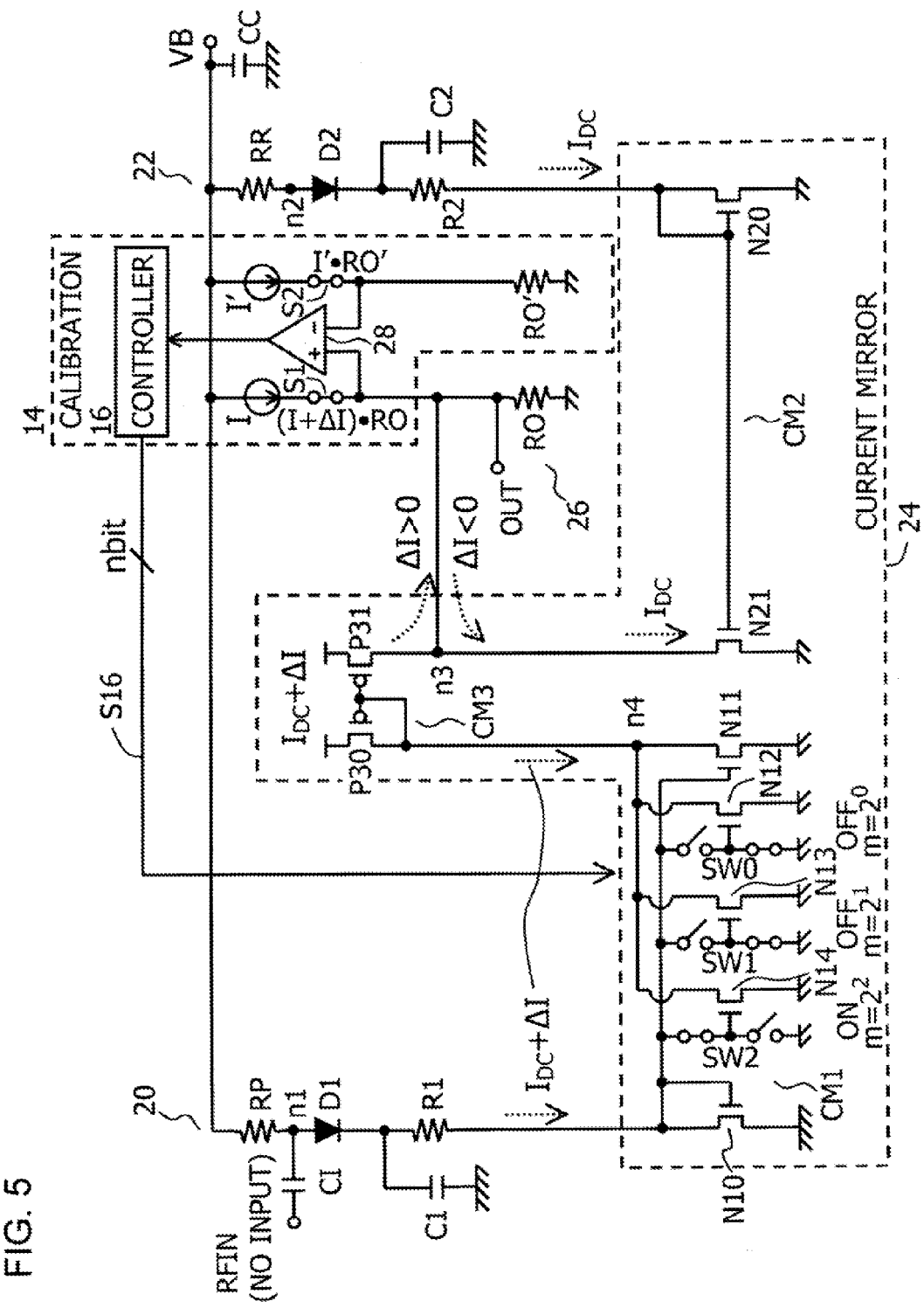
FIG. 5 is a detailed drawing illustrating the power detector circuit in the first embodiment.

FIG. 5 is a detailed drawing illustrating the power detector circuit in the first embodiment. Operation during error current occurrence is explained, referring to FIG. 5. The error current $\Delta I$ is explained using a model in which, in the zero-input state in which an AC signal is not being input to the input terminal RFIN, of the current flowing at the node n3 at which the difference current is ultimately obtained, the current flowing in the PMOS transistor P31 is $I_{DC}+\Delta I$, and the current flowing in the NMOS transistor N21 is $I_{DC}$.

That is, in the above model the relative errors of the diodes and the copying errors of the current mirrors are all combined and represented as the error current $\Delta I$. At this time, an error current $\Delta I$ flows in the output resistor RO from the node n3. When $\Delta I > 0$, the output potential is OUT=RO·$\Delta I$, and an offset voltage occurs. For example, when RO=10 Ω and $\Delta I$=1 µA, the offset potential is 10 mV. Further, when $\Delta I < 0$, the current flowing in the output resistor RO is zero, so that the output potential OUT=0 V. However, in the calibration circuit 14 illustrated in FIG. 5, a current source I is provided, and I±$\Delta I$ flows in the output resistor RO. This operation is described below.

Figure 6:
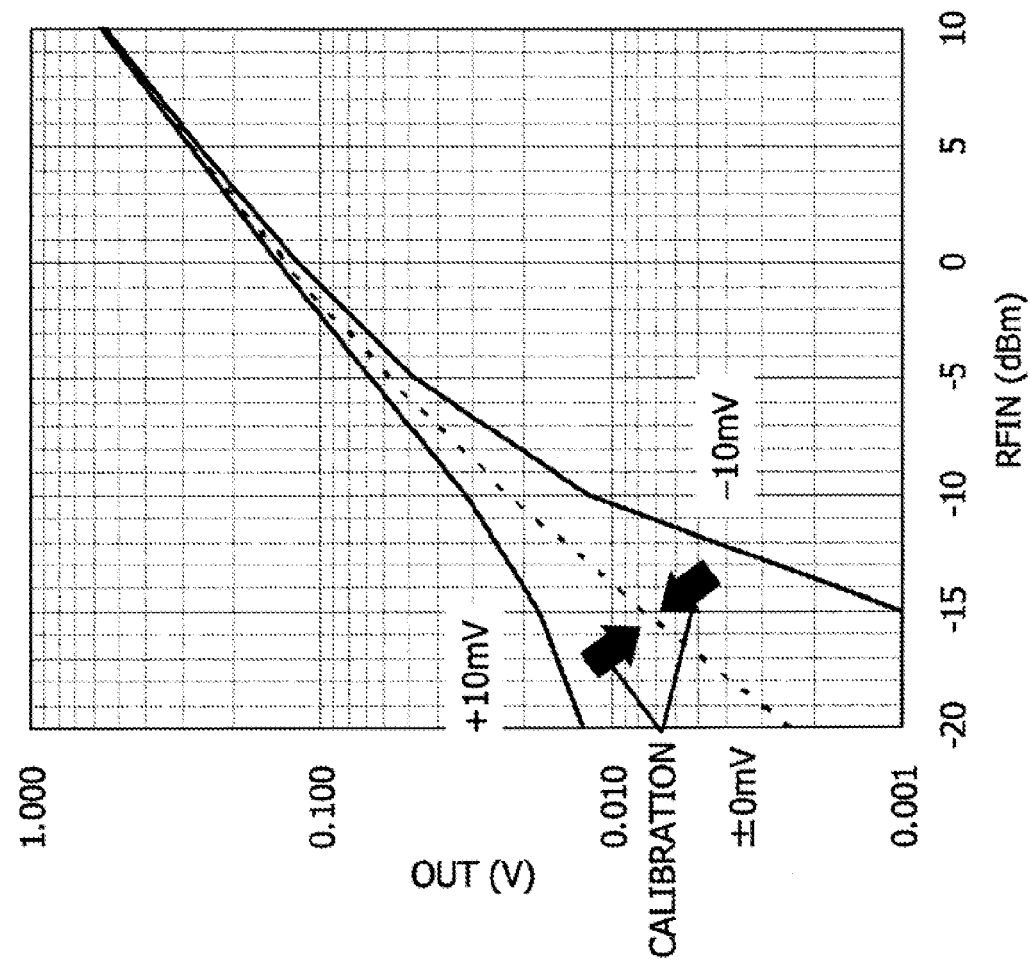
FIG. 6 illustrates simulation results for the input/output characteristics of a power detector circuit when an error current occurs.

FIG. 6 illustrates the simulation results of the input/output characteristics of a power detector circuit when an error current occurs. Approximately −20 dBm is assumed for the state in which the input to the above-described input terminal RFIN is zero, and the simulation results are for cases in which errors of ±10 mV occur as the offset potential due to an error current $\Delta I$. When an error is occurring, there is a very large influence in the region of low input power RFIN (for example −10 dBm or lower) in particular, and the output potential OUT of the solid line is shifted greatly compared with the dotted-line waveform of ±0 mV at which there is no error. Hence calibration is performed to reduce the error to zero, as indicated by the arrows in FIG. 6.

(3) Calibration Operation (Operation To Reduce Errors)

As explained above, in order to reduce error currents arising from relative variation in diodes and current mirroring errors, the power detector circuit of this embodiment has a calibration circuit. The calibration circuit of FIG. 5 has a current source which supplies a constant current I to the output resistor RO; a comparator 28 which compares the magnitudes of the difference voltages with a constant current I' and resistor RO' which generate a reference potential; and a calibration control circuit 16 which performs switching control according to the result of the comparator, and adjusts the current mirror ratio of the current mirror circuit CM1.

In the state in which the AC signal input to the input terminal RFIN is zero, the sum current of the error current $\Delta I$ from the node n3 to the output resistor RO and the constant current I flows to the positive input terminal of the comparator 28 of the calibration circuit 14, so that the voltage (I+$\Delta I$)·RO is applied. The reference voltage I'·RO' is applied to the negative input terminal of the comparator 28. Settings are made such that the resistor RO=RO' and the constant current I=I', so that in cases where the error current ΔI is not zero, the voltage at the positive input terminal of the comparator shifts from the reference voltage I·RO (=I'·RO') by the voltage ±ΔI·RO. Hence by monitoring the output of the comparator 28, the sign of an error current ΔI can be detected. That is, when the comparator output=high, ΔI>0, and when the output is low, ΔI<0.

The calibration control circuit 16 performs control to change the current mirror ratio of the current mirror circuit CM1 based on the sign of the comparison result, and to set the optimum mirror ratio to cause the error current ΔI to approach zero. For example, the calibration control circuit 16 executes calibration once at the time of power activation, sets the current mirror ratio for the current mirror circuit CM1, and thereafter the power detector circuit performs normal operation in this setting state, so that the effect of an error current can be suppressed or eliminated during the normal operation. Further, this calibration operation can also be executed utilizing an interval represented by the transition gap in which a communication terminal equipped with the power amplifier of FIG. 2 is not performing communication in time-division duplex (TDD) communication or similar, that is, an interval in which the high-frequency input is zero. By executing such calibration, even in cases where the error current ΔI deviates from that at the time of power activation due to temperature changes and power supply voltage changes during normal power detection operation, the error current ΔI can be brought closer to 0, returning to an optimal state.

Figure 7A:
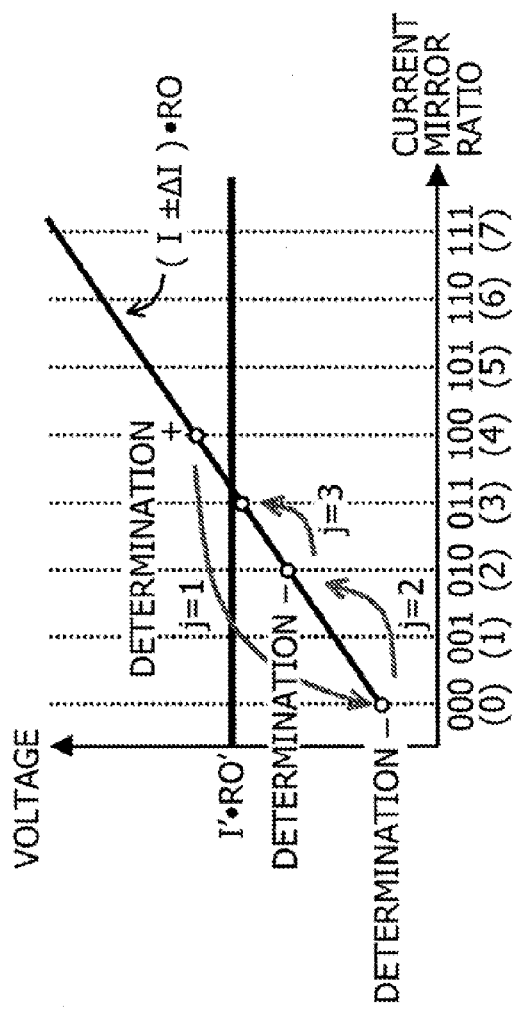
FIG. 7A illustrates a control sequence by the calibration control circuit 16 to search for the optimum current mirror ratio.
Figure 7B:
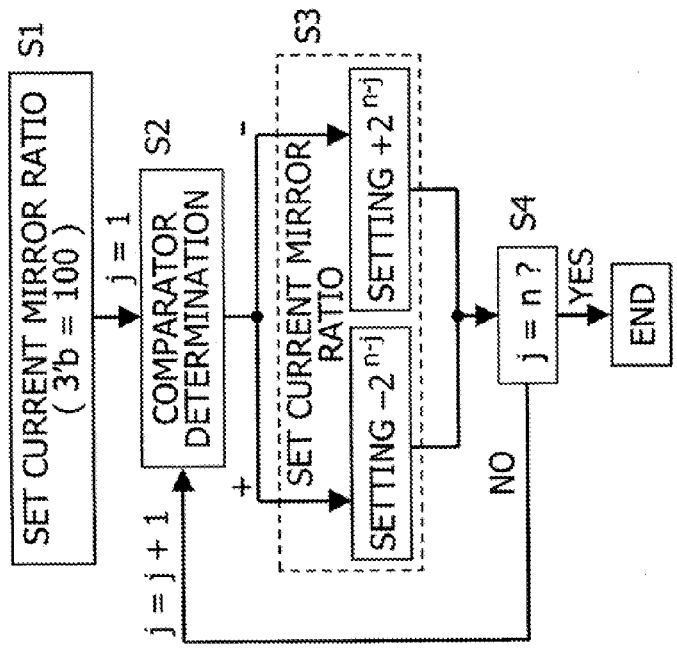
FIG. 7B illustrates a voltage change by the calibration control circuit 16 to search for the optimum current mirror ratio.

FIG. 7A and FIG. 7B illustrate a control sequence by the calibration control circuit 16 to search for the optimum current mirror ratio. As illustrated in FIG. 5, the calibration control circuit 16 generates an n-bit control code S16 to control switches SW0, SW1, SW2 provided at the gates of the NMOS transistors N12, N13, N14 for current mirror ratio adjustment of the current mirror circuit CM1, based on the output of the comparator 28 corresponding to the sign of the error current ΔI.

The mirror current of the current flowing in the resistor R1 of the input circuit 20, that is, the current flowing from the PMOS transistor P31 to the node n3, is here called the rectified current, and the mirror current of the current flowing in the resistor R2 of the reference circuit 22, that is, the current flowing from the node n3 to the NMOS transistor N21, is called the reference current.

FIG. 7A and FIG. 7B illustrate an example of control in which binary search is used in automatic searching for an appropriate current mirror ratio. FIG. 7A illustrates a state machine of the calibration control circuit 16. In FIG. 7A, j indicates the number of times the current mirror ratio is set; here it is assumed that the number of bits of the control code S16 is n=3, and that the sign of the error current prior to calibration is ΔI>0. In the initial setting j=1, the control code S16 is the default setting, that is, the code S16=100 performs on/off/off control of the switches SW2, SW1, SW0 of the transistors N14, N13, N12 for current mirror ratio adjustment, respectively.

For a switch to be on means that the gate of the transistor used for current mirror adjustment is parallel-coupled in common with the transistor N11 of the mirror source; and for a switch to be off means that the gate of the transistor for adjustment is clipped to ground VSS. The number of transistors for adjustment N14, N13 and N12 which are turned on/off is weighted by the two's complement, controlled such that m=$2^2$ by switch SW2, m=$2^1$ by switch SW1, and m=$2^0$ by switch SW0. Hence by a freely selected combination of three control code bits, the total channel width of the transistors for adjustment is varied in the range m=1 to 7.

For example, when the control code S16 is 000, all the switches SW2, SW1, SW0 are turned off, and the total channel width of the NMOS transistors on the side of the node n4 is small, so that the current copied to the node n4 is small. Conversely, when the control code S16 is 111, all the switches SW2, SW1, SW0 are turned on, the total channel width of the NMOS transistors on the side of the node n4 is large, and the current copied to the node n4 is large.

FIG. 7B represents the relation between the current mirror ratio and the input potential of the comparator 28, (I±ΔI)·RO and I'·RO'. At the initial setting j=1, the current mirror ratio is set to SW2, SW1, SW0=1, 0, 0 (=4) (S1 in FIG. 7A). At this setting, it is assumed that the offset current ΔI>0, and so the relation to the input voltage of the comparator is (I+ΔI)·RO>I'·RO'. Hence the comparison result of the comparator is high (the "+" judgment in FIG. 7B).

From this comparison result it is determined that ΔI>0, and so based on this, the calibration control circuit 16 changes the setting value of the control code S16 such that the error current ΔI is made smaller. That is, in order to reduce the error current ΔI, either the rectified current on the side of the PMOS transistor P31 is reduced, or the reference current on the side of the NMOS transistor N21 is increased. In the example of FIG. 5, the current mirror ratio of the current mirror circuit CM1 is controlled, and so control is performed to reduce the error current.

As illustrated in FIG. 7A, when the determination of the comparator (S2) is "+", the setting is changed to "current setting $-2^{n-j}$". That is, when the number of settings j=1, $4-2^{(3-1)}=0$, and so the control code S16 is changed to SW2, SW1, SW0=0, 0, 0 (=0) (S3).

For the setting code 000 (=0) at the number of settings j=2 after modification, the current mirror adjustment transistors N14, N13, N12 are all turned off, and as illustrated in FIG. 7B, the positive input voltage (I±ΔI)·RO of the comparator 28 is lower than the reference voltage I'·RO'. As a result, the comparison result of the comparator is low (determination "−"). From this result, the sign of the error current becomes ΔI<0, and it is determined that the rectified current on the side of the PMOS transistor P31 was reduced too much. Hence the calibration control circuit 16 now changes the setting value of the control code to $0+2^{(3-2)}=2$, that is, changes the control code S16 to SW2, SW1, SW0=0, 1, 0 (=2), so as to increase slightly the error current ΔI (S3).

For the setting code 010 (=2) at the number of settings j=3 after modification, similar determination by the comparator is performed, and low (determination "−") is obtained. It is found that as yet ΔI<0, and the rectified current is small, so that the calibration control circuit 16 changes the setting value of the control code S16 to $2+2^{(3-3)}=3$, that is, changes the control code to SW2, SW1, SW0=0, 1, 1 (=3) (S3). At this time, the number of settings j is equal to the number of bits n=3 of the control code (S4), and calibration control by the calibration control circuit 16 ends.

As explained above, through calibration operation the setting value for the current mirror ratio is changed from the default 100 (=4) to 011 (=3), the total channel width of the NMOS transistors on the side of the node n4 is made smaller, and the error current ΔI is changed so as to approach zero. As a result, the rectified current on the side of the PMOS transistor P31 can be controlled so as to more closely approach the reference current on the side of the NMOS transistor N21. And as a result, the input/output characteristic of the power detector circuit can be adjusted to a more linear characteristic, with a smaller offset with respect to an ideal characteristic as illustrated in FIG. 6 (dashed line). In such binary search control, comparison is performed in order from higher bits for a number of times equal to the number of control bits n, and based on comparison results the settings of the lower bits are changed in order, so that such a procedure can be realized using a small-scale logic circuit.

In FIG. 5, NMOS transistors to adjust the current mirror ratio may be provided in parallel on the side of the NMOS transistor N10. In this case, if the number of transistors on the side of the NMOS transistor N10 is increased, the current copied to the side of the node n4 is reduced, and if the number is decreased, the current is enlarged.

(Modified Examples of First Embodiment)

Figure 8:
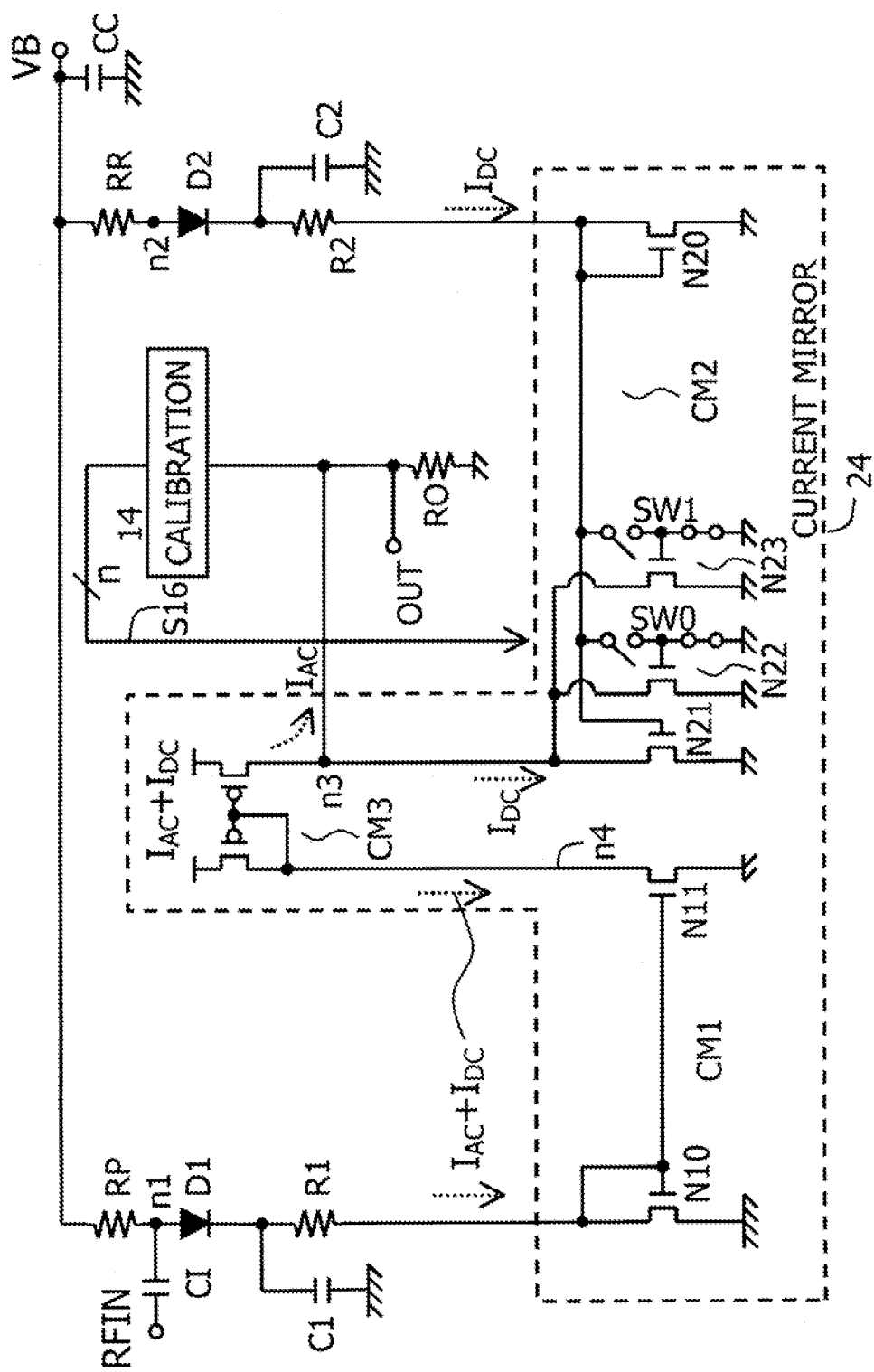
FIG. 8 illustrates a Modified Example 1 of the power detector circuit of the first embodiment.

FIG. 8 illustrates a Modified Example 1 of the power detector circuit of the first embodiment. In this Modified Example 1, the current mirror ratio of the current mirror circuit CM2 is adjusted. To this end, the adjustment transistors N22 and N23 are provided in parallel with the NMOS transistor N21 of the current mirror circuit CM2, and switches SW0 and SW1 to the gates thereof are controlled to be turned on and off by the control code S16 of the control circuit within the calibration circuit 14. By this means, the magnitude of the reference circuit on the side of the transistor N21 is adjusted. The calibration method is the same as that described above. It is desirable that the adjustment transistors N22 and N23 have channel widths set to powers of 2, similarly to FIG. 5. Further, three adjustment transistors may be provided, similarly to FIG. 5. And, adjustment transistors may be provided in parallel with the transistor N20.

Figure 9:
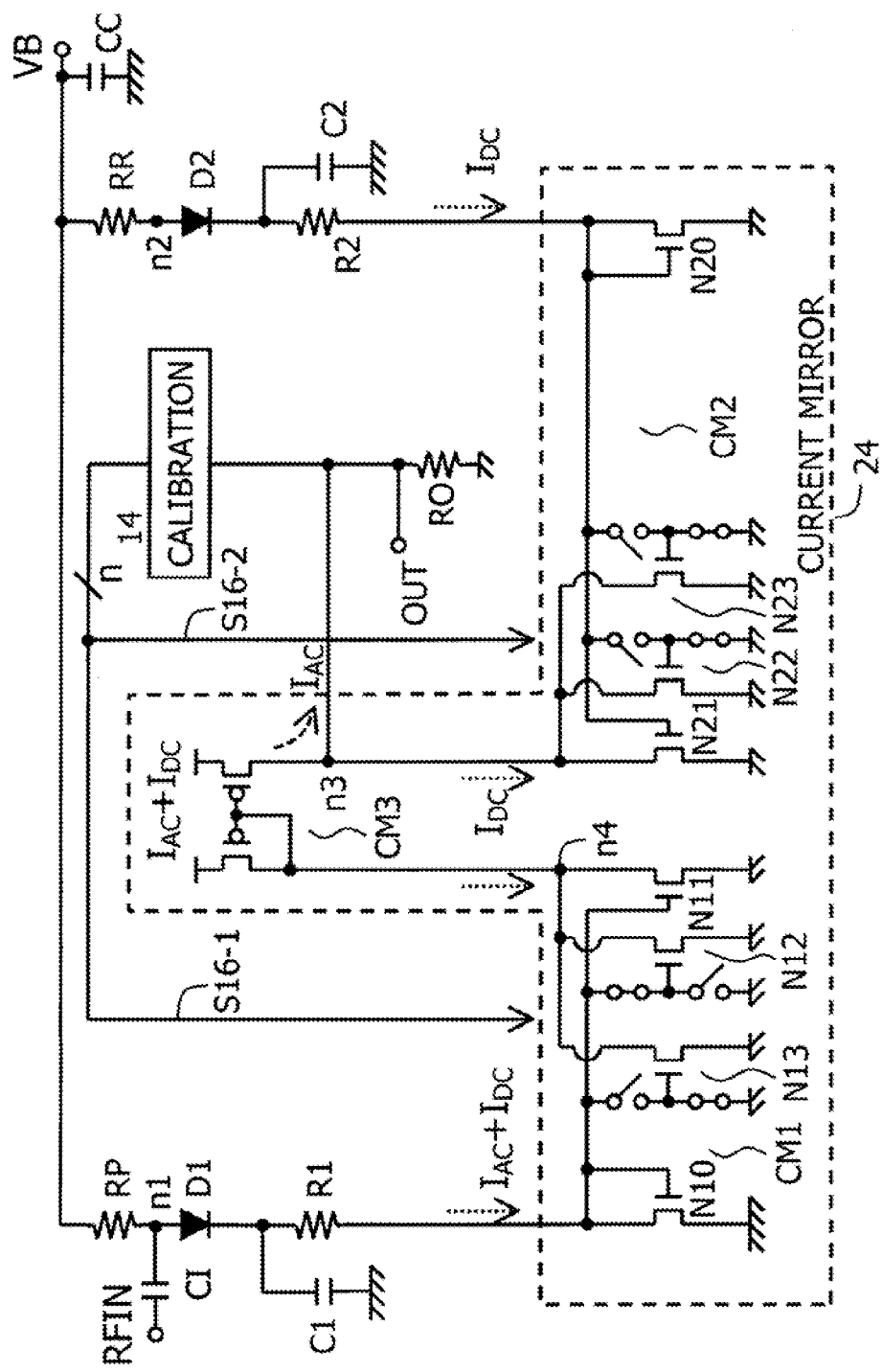
FIG. 9 illustrates a Modified Example 2 of the power detector circuit of the first embodiment.

FIG. 9 illustrates a Modified Example 2 of the power detector circuit in the first embodiment. In this Modified Example 2, both the rectified current and the reference current are adjusted. That is, the rectified current is adjusted by the current mirror ratio of the current mirror circuit CM1, and the reference current is also adjusted by the current mirror ratio of the current mirror circuit CM2. By adjusting both, the resolution with which the current mirror ratio is adjusted can be improved, so that finer control is possible, and the precision of the error current reduction can be enhanced.

In the calibration method of Modified Example 2, after adjusting the current mirror ratio of the current mirror circuit CM1 on the side of the rectified current, the current mirror ratio of the current mirror circuit CM2 on the side of the reference current may be adjusted, so that the current mirror ratios may be independently adjusted. That is, the calibration circuit 14 initially sets a control code S16-1, and then sets a control code S16-2.

Figure 10:
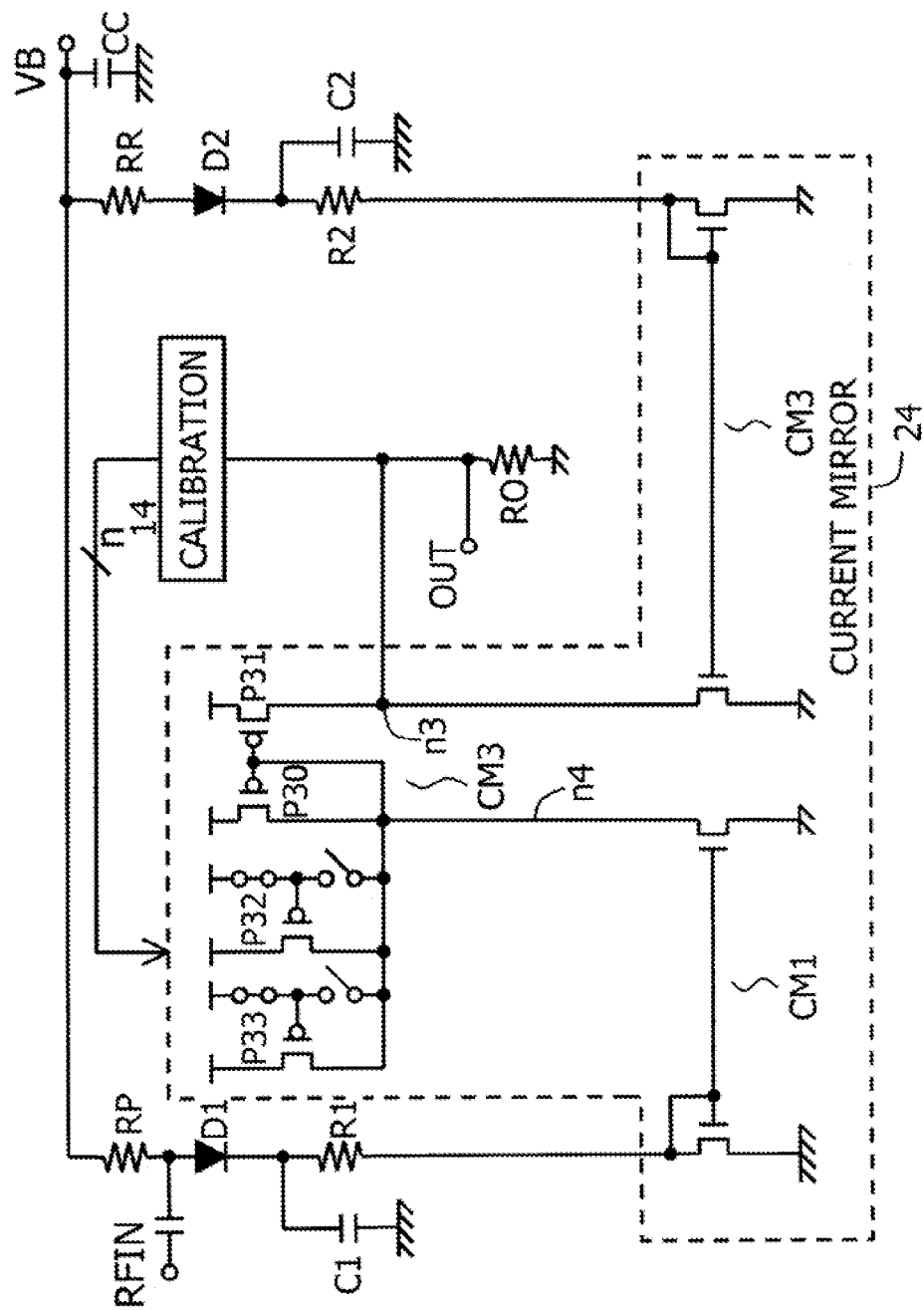
FIG. 10 illustrates Modified Example 3 of the power detector circuit of the first embodiment.
Figure 11:
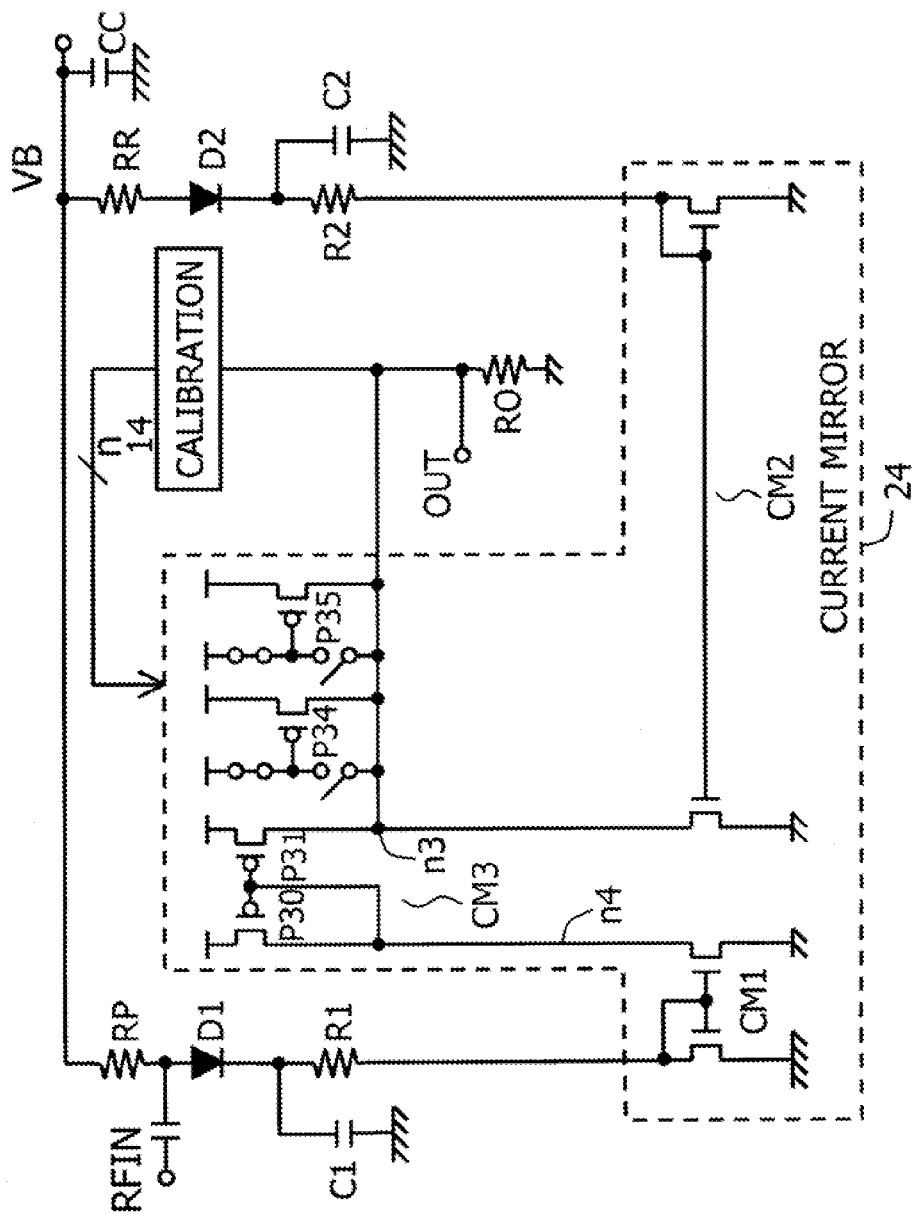
FIG. 11 illustrates Modified Example 3 of the power detector circuit of the first embodiment.
Figure 12:
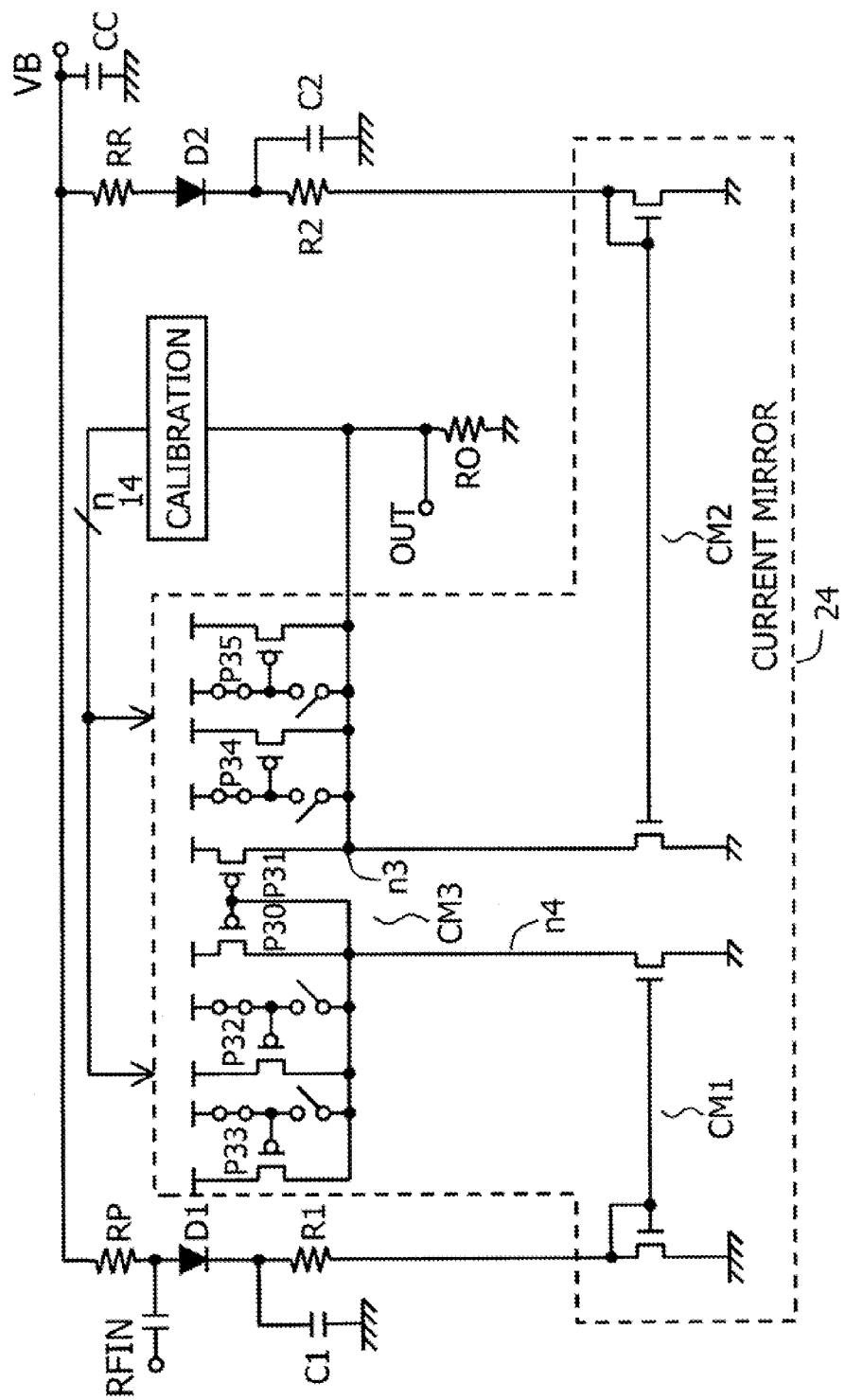
FIG. 12 illustrates Modified Example 3 of the power detector circuit of the first embodiment.

Further, for example the transistor channel widths of the adjustment transistors N12 and N13 on the side of the current mirror circuit CM1 may be made larger than those of the adjustment transistors N22 and N23 on the side of the current mirror circuit CM2, by for example twofold. In this case, coarse adjustment of the error current is performed through the current mirror ratio on the rectified current side, and then fine adjustment of the error current can be performed through the current mirror ratio on the reference current side, so that the precision of the error current reduction can be improved and the range over which error correction can be performed is expanded. FIG. 10, FIG. 11 and FIG. 12 illustrate Modified Example 3 of the power detector circuit of the first embodiment. In FIG. 3, FIG. 8 and FIG. 9, the total channel width of the NMOS transistors is adjusted by the current mirror ratios of the current mirror circuits CM1 and CM2, whereas in FIG. 10, FIG. 11 and FIG. 12 the total channel width of the PMOS transistors is adjusted by the current mirror ratio of the current mirror circuit CM3.

In FIG. 10, adjustment transistors P32 and P33 are provided in parallel with the transistor P30, and the switches thereof are controlled through a control code. In FIG. 11, adjustment transistors P34 and P35 are provided in parallel with the transistor P31, and the switches thereof are controlled through a control code. In FIG. 12, adjustment transistors P32, P33, P34, P35 are provided at both the transistors P30 and P31, and the switches thereof are each controlled through a control code.

In general, the channel widths of the transistors of a current mirror circuit are often set to be larger for PMOS transistors than for NMOS transistors. PMOS transistors enable design of a greater number of transistors per unit transistor channel width, so that the current mirror ratio can easily be set with greater flexibility and more finely, adjustment resolution is increased, and there is the possibility that the error current is reduced with higher precision.

Figure 13:
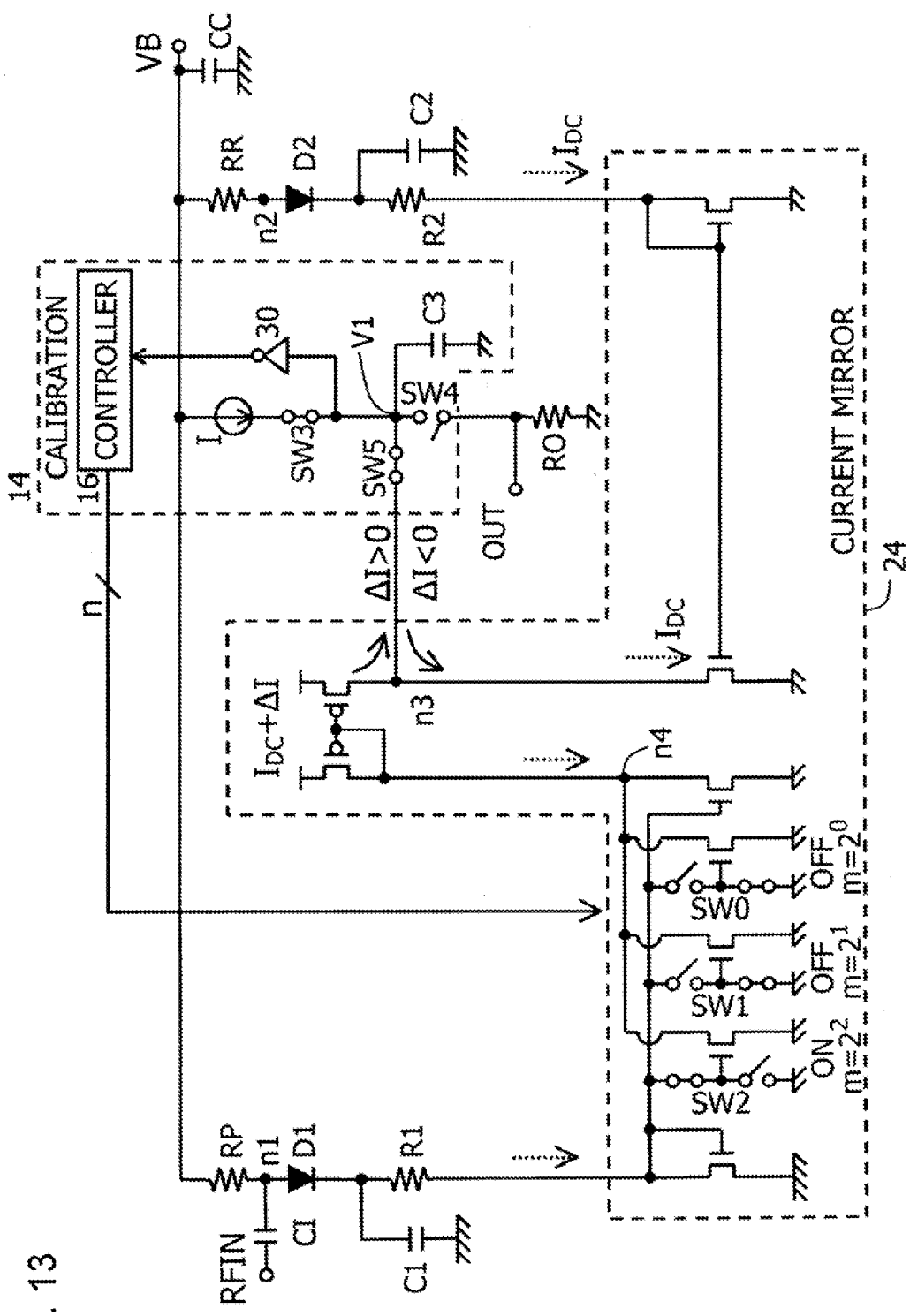
FIG. 13 illustrates Modified Example 4 of the first embodiment.

FIG. 13 illustrates Modified Example 4 of the first embodiment. In FIG. 5, the calibration circuit 14 has a comparator 28 which compares the voltage on the side of the output resistor RO and the voltage on the side of the reference resistor RO'. On the other hand, in Modified Example 4 in FIG. 13, the comparator in the calibration circuit 14 has an inverter 30, and there is no circuit on the side of the resistor RO' which generates the reference voltage.

That is, the calibration circuit 14 has a reference current source I, switches SW3, SW4, SW5, a capacitor C3, and an inverter 30. The switch SW3 is synchronized with a system clock CLK of known frequency to perform on/off control, and during on intervals passes the reference current I to the capacitor C3.

Figure 14:
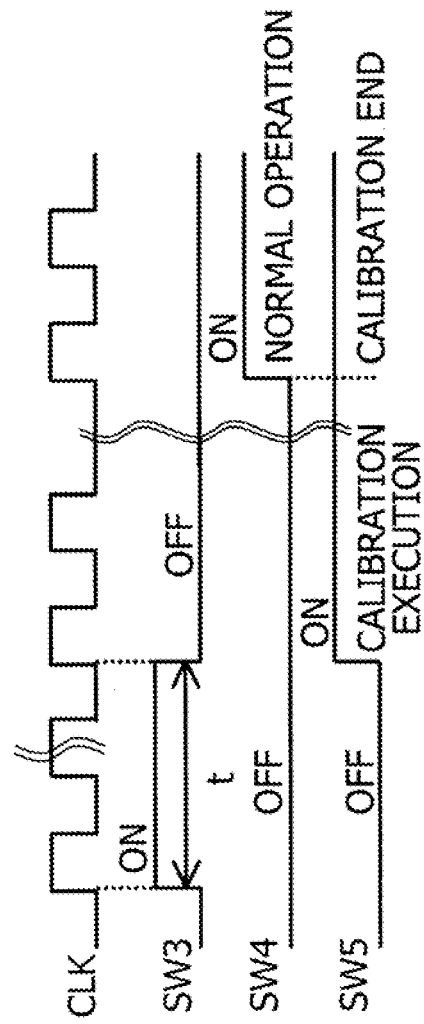
FIG. 14 is a timing chart representing operation of the calibration circuit in Modified Example 4.

FIG. 14 is a timing chart representing operation of the calibration circuit in Modified Example 4. Initially the switches SW4 and SW5 are turned off, and for example the switch SW3 is turned on for four clock periods. By this means, the reference current I all flows to the capacitor C3 regardless of the error current ΔI. If the potential at one terminal of the capacitor C3 is V1, the following equation (1) is obtained.

$$V1 = I \cdot t / C3 \tag{1}$$

That is, the voltage V1 is determined as a constant value by the known current I, time (four periods of the clock CLK) t, and capacitance C3. This potential V1 is set in advance to be the same potential as the threshold of the inverter 30.

For example, when the threshold of the inverter 30 is 1.6 V, the parameters are set as follows, I=10 μA, C3=1 pF, the system clock CLK is 25 MHz and the switch SW3 is turned on for the interval of four clock periods, that is, t=160 ns, so that the voltage V1 can be set to V1=1.6 V.

Then, when switch SW3 is turned off and switch SW5 is turned on, a charge corresponding to the current of the error current ΔI charges the capacitor C3, or is discharged from the capacitor C3. Hence the potential V1 which had been set to the threshold of the inverter 30 changes, and the output of the inverter 30 changes to low when ΔI>0 and changes to high when ΔI<0. In this way, the inverter 30 has a comparison function equivalent to that of the comparator 28. That is, even when a reference potential I'·RO' is not provided in the calibration circuit of FIG. 5, by monitoring the output of the inverter 30, the sign of the error current ΔI is known, and so the circuit area can be smaller than that of FIG. 5.

The method of searching for the optimum current mirror ratio setting is the same as for FIG. 5. After the end of the calibration operation, the switches SW4 and SW5 are turned on and the switch SW3 is turned off, to enter normal operation mode. The series of control of these switches SW3 to SW5 is performed by the calibration control circuit 16 similarly to the current mirror ratio control of switches SW0 to SW2.

(Second Embodiment)

Figure 15:
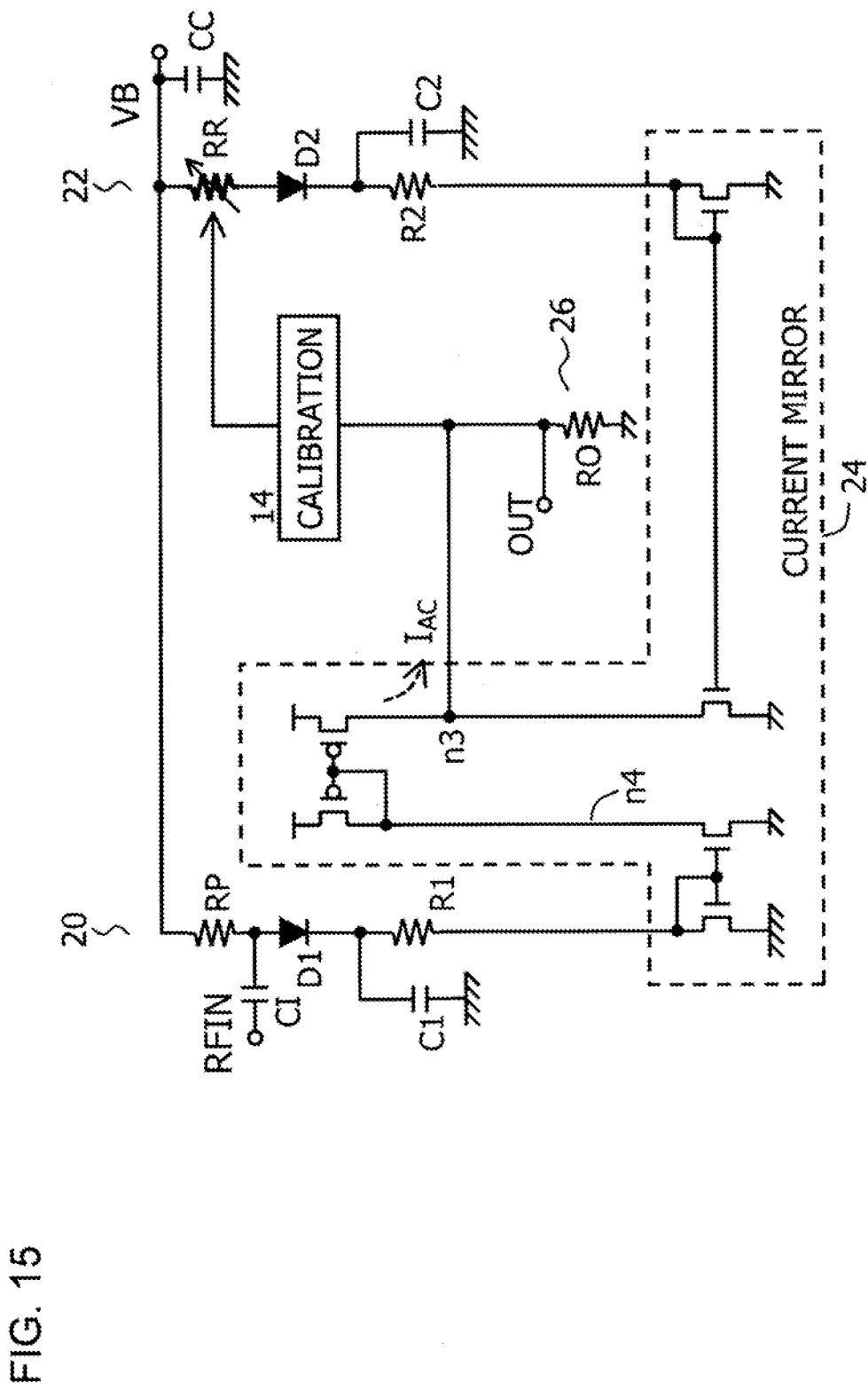
FIG. 15 illustrates the power detector circuit of a second embodiment.

FIG. 15 illustrates the power detector circuit of a second embodiment. In this power detector circuit, similarly to the first embodiment, an input circuit 20 and reference circuit 22 are provided, the difference $I_{AC}$ in the currents generated by the two diodes D1 and D2 is generated at the node n3 by the difference current generation circuit 24, this difference current $I_{AC}$ is passed to the output resistor RO, and the voltage thereof is output from the output terminal OUT.

On the other hand, in this power detector circuit, the calibration circuit 14 monitors the sign of the error current ΔI while adjusting the resistance value of the second resistor RR which supplies a constant voltage VB within the reference circuit 22. Or, in addition to the second resistor RR, a fourth resistor R2 may also be adjusted. Or, in place of the second resistor RR, the fourth resistor R2 may be adjusted. Whatever the adjustments being made, the reference current flowing in the fourth resistor R2 can be variably adjusted. Therefore, by changing the value of the reference current, the error current ΔI can be adjusted.

In the second embodiment, the resistance value of the variable resistor RR is adjusted. In this case, by employing a circuit which uses a switch to select the number of unit resistors, a variable resistor can easily be realized, so that adjustment of the resistance value, that is, fine adjustment of the reference current, can be performed more finely, and the error current can be made to approach zero with high precision.

Further, there is no longer a need for the group of the plurality of adjustment transistors and switches in the current mirror circuit of the first embodiment, so that the circuit area can be reduced.

The method of power detection in the second embodiment is the same as in the first embodiment. In the calibration method also, similarly to the first embodiment, in a state in which input of the high-frequency signal is intercepted, while monitoring the sign of the error current ΔI occurring at the node n3, the optimum resistance value is set for the second resistor RR.

As explained above, by means of a power detector circuit of these embodiments, the difference between the currents generated by two diodes D1 and D2 is generated by a difference current generation circuit 24, and the power value of the input signal is detected from this difference current. Hence there is no problem with output fluctuation caused by the offset voltage or power supply voltage when a differential amplifier is used as in the prior art, and power values is detected with high precision.

Further, by means of a power detector circuit of these embodiments, because there is no direct path from diodes to ground, current consumption is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A detector circuit, comprising:
a first diode, to an anode of which an AC signal is input and to which a constant voltage is supplied via a first resistor;
a second diode, to an anode of which the constant voltage is supplied via a second resistor;
a difference current generation circuit, which generates a difference current between a first current flowing in the first diode and a second current flowing in the second diode; and
a calibration circuit which, in a state in which input of the AC signal is intercepted, variably sets a resistance value of the second resistor such that the difference current is reduced.

2. The detector circuit according to claim 1, wherein the difference current generation circuit comprises:
a first current mirror circuit which is provided on a cathode side of the first diode, and which generates a third current having a current value which is a product of the first current and a first current mirror ratio;
a second current mirror circuit which is provided on a cathode side of the second diode, and which generates a fourth current having a current value which is a product of the second current and a second current mirror ratio;
a third current mirror circuit, which generates either a fifth current having a current value which is a product of the third current and a third current mirror ratio, or a sixth current having a current value which is a product of the fourth current and the third current mirror ratio; and
a coupling node at which are coupled a path of the fifth current and a path of the fourth current, or a coupling node at which are coupled a path of the sixth current and a path of the third current, wherein
the difference current is generated at the coupling node.

3. The detector circuit according to claim 1, wherein the calibration circuit comprises a comparator which detects a sign of the difference current, and a calibration control circuit which performs the variable setting according to a comparison result of the comparator.

4. The detector circuit according to claim 3, wherein the calibration circuit comprises a calibration capacitance to which a current for calibration is supplied via a first switch, a second switch provided between the coupling node and the calibration capacitance, an inverter which inputs a voltage to the coupling node, and the calibration control circuit which performs the variable setting according to an output of the inverter when the first switch is turned on and the calibration capacitance is charged to the threshold voltage of the inverter, after which the first switch is turned off and the second switch is turned on, and the difference current is supplied to the calibration capacitance.

5. The detector circuit according to claim 2, comprising:
a first smoothing circuit provided between the cathode of the first diode and the first current mirror circuit; and
a second smoothing circuit provided between the cathode of the second diode and the second current mirror circuit.

6. The detector circuit according to claim 5, wherein the first smoothing circuit comprises a first smoothing capacitor coupled to the cathode of the first diode and a third resistor provided between the cathode of the first diode and the first current mirror circuit, and the second smoothing circuit comprises a second smoothing capacitor coupled to the cathode of the second diode and a fourth resistor provided between the cathode of the second diode and the second current mirror circuit.

7. The detector circuit according to claim 2, further comprising an output circuit which outputs a magnitude of the difference current.

8. The detector circuit according to claim 3, further comprising an output circuit which outputs a magnitude of the difference current, wherein
the output circuit has an output resistor provided between the coupling node and ground, and an output terminal which outputs a voltage of the output resistor; and
the calibration circuit has a first current source supplied to the output node, a second series circuit of a second current source and a reference resistor provided in parallel with a first series circuit of the first current source and the output resistor, a comparator which compares the voltages of the output resistor and the reference resistor, and a calibration control circuit which performs the variable setting according to a comparison result of the comparator.

9. The detector circuit according to claim 7, wherein the output circuit has an output resistor provided between the coupling node and ground, and an output terminal which outputs a voltage of the output resistor.

10. A detector circuit, comprising:
a first rectifying circuit, which rectifies a voltage resulting by adding a voltage corresponding to an input signal and a first voltage based on a bias voltage;
a first resistor coupled between the first rectifying circuit and a power supply generating the bias voltage; and
a first current detector circuit, which detects a current rectified by the first rectifying circuit;
a second rectifying circuit, which rectifies a second voltage based on the bias voltage;
a second resistor coupled between the second rectifying circuit and the power supply, the second resistor having a variable resistance;
a second current detector circuit, which detects a current rectified by the second rectifying circuit;
a current difference detector circuit, which detects a difference between a current detected by the first current detector circuit and a current detected by the second current detector circuit; and
a control circuit which outputs a control signal according to the difference; wherein
the control circuit adjusts a resistance value of the second resistor such that the difference is reduced when the input signal is a null signal.

11. The detector circuit according to claim 10, further comprising a current-voltage conversion circuit which converts the difference into a voltage.

12. The detector circuit according to claim 11, wherein
the control circuit comprises a first constant-current source coupled between the current-voltage conversion circuit and a power supply, a second constant-current source one terminal of which is coupled to the power supply, and a comparator which compares a voltage of a coupling node of the current-voltage conversion circuit and the first constant-current source, with a voltage of the other terminal of the second constant-current source, wherein
the control circuit outputs a control signal according to an output result of the comparator.

* * * * *